United States Patent
Kim et al.

(10) Patent No.: US 10,439,651 B2
(45) Date of Patent: Oct. 8, 2019

(54) METHOD AND APPARATUS FOR REDUCING FALSE DECODING

(71) Applicant: Samsung Electronics Co., Ltd., Gyeonggi-do (KR)

(72) Inventors: Daeson Kim, Seoul (KR); Mingoo Kim, Gyeonggi-do (KR); Chaehag Yi, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/211,486

(22) Filed: Jul. 15, 2016

(65) Prior Publication Data

US 2017/0033807 A1  Feb. 2, 2017

(30) Foreign Application Priority Data

Jul. 29, 2015 (KR) ........................ 10-2015-0107491

(51) Int. Cl.
*H03M 13/41* (2006.01)
*H03M 13/53* (2006.01)

(52) U.S. Cl.
CPC ... *H03M 13/4115* (2013.01); *H03M 13/4161* (2013.01)

(58) Field of Classification Search
CPC ......... H03M 13/4115; H03M 13/4161; H03M 13/4146; H03M 13/413; H03M 13/4138
See application file for complete search history.

(56) References Cited

U.S. PATENT DOCUMENTS

| | | | |
|---|---|---|---|
| 5,537,444 A | 7/1996 | Nill et al. | |
| 5,784,392 A * | 7/1998 | Czaja | H03M 13/4169 714/786 |
| 6,105,158 A | 8/2000 | Chen et al. | |
| 6,378,106 B1 | 4/2002 | Allpress et al. | |
| 6,996,196 B2 | 2/2006 | Kubo et al. | |
| 7,197,689 B2 | 3/2007 | Hekstra et al. | |
| 7,333,572 B2 * | 2/2008 | Nair | H04L 25/03197 375/262 |
| 7,499,507 B2 * | 3/2009 | Jaffe | H04L 1/005 348/735 |

(Continued)

FOREIGN PATENT DOCUMENTS

| | | |
|---|---|---|
| JP | 2002314435 | 10/2002 |
| KR | 1020080069258 | 7/2008 |

OTHER PUBLICATIONS

IEEE 100, The authoritative Dictionary of IEEE Standards Terms, Seventh Edition, IEEE Standards, pp. 197, 872, 934, 1049, 1198, 1210 (Year: 2000).*

(Continued)

*Primary Examiner* — April Y Blair
*Assistant Examiner* — Dipakkumar B Gandhi
(74) *Attorney, Agent, or Firm* — The Farrell Law Firm, P.C.

(57) ABSTRACT

Methods and apparatuses are provided for operating a list Viterbi decoder. A path metric difference (PMD) threshold is set based on an input signal level and a PMD limit value. Decoding is performed by using the PMD threshold. Performing the decoding includes determining a PMD of a best path, comparing the determined PMD and the PMD threshold, and declaring a decoding failure and ending performing of the decoding, if the PMD is greater than or equal to the PMD threshold.

20 Claims, 12 Drawing Sheets

(56) References Cited

U.S. PATENT DOCUMENTS

| | | |
|---|---|---|
| 8,116,354 B2 | 2/2012 | Chen |
| 2007/0116143 A1 | 5/2007 | Bjerke et al. |
| 2009/0016469 A1 | 1/2009 | Li et al. |
| 2010/0064201 A1* | 3/2010 | Zhao ............... G11B 20/10009 714/795 |
| 2010/0278287 A1* | 11/2010 | Hansen ............ H03M 13/4107 375/341 |
| 2012/0036416 A1* | 2/2012 | Wang ............... H03M 13/4115 714/795 |
| 2014/0173381 A1 | 6/2014 | Lee et al. |

OTHER PUBLICATIONS

Nill, Christiane et al., List and Soft Symbol Output Viterbi Algorithms: Extensions and Comparisons, IEEE Transactions on Communications vol. 43, No. 2/3/4, Feb./Mar./Apr. 1995, Copyright 1995 IEEE, pp. 277-287.

Seshadri, Nambirajan et al., List Viterbi Decoding Algorithms with Applications, IEEE Transactions on Communications vol. 42, No. 2/3/4, Feb./Mar./Apr. 1994, Copyright 1994 IEEE, pp. 313-323.

\* cited by examiner

METHOD AND APPARATUS FOR REDUCING FALSE DECODING

PRIORITY

This application claims priority under 35 U.S.C. § 119(a) to Korean Patent Application No. 10-2015-0107491, filed in the Korean Intellectual Property Office on Jul. 29, 2015, the entire disclosure of which is incorporated herein by reference.

BACKGROUND

1. Field of the Disclosure

The present disclosure relates generally to a decoding method and an apparatus of a list Viterbi decoder (LVD), and more particularly, to a method and an apparatus for reducing false decoding in an LVD.

2. Description of the Related Art

An LVD uses an algorithm for determining a value corresponding to a number of candidate groups of code words, for finding a pre-set number of code words most similar to a best path, and for determining an error-free code through an error detector. That is, the LVD may determine a candidate group of code words by a list count by using an algorithm for extending a distance from a code word that corresponds to the best path.

SUMMARY

Embodiments of the present disclosure provide methods and apparatuses for reducing false decoding.

According to an embodiment of the present disclosure, a method is provided for operating a list Viterbi decoder. A path metric difference (PMD) threshold is set based on an input signal level and a PMD limit value. Decoding is performed by using the PMD threshold. Performing the decoding includes determining a PMD of a best path, comparing the determined PMD and the PMD threshold, and declaring a decoding failure and ending performing of the decoding, if the PMD is greater than or equal to the PMD threshold.

According to an embodiment of the present disclosure, a method is provided for operating a list Viterbi decoder. A PMD threshold is set by using an input signal level and a PMD limit value. Decoding is performed by using the PMD threshold. Performing the decoding includes detecting an error on a result of the decoding, determining whether an accumulated PMD exceeds a threshold according to the detected error, and determining a path for generating a code word and generating the code word corresponding to the path, if the accumulated PMD does not exceed the threshold.

According to an embodiment of the present disclosure, a list Viterbi decoder apparatus is provided and includes a list Viterbi decoder, and an error detector configured to check an error of a code word decoded in the list Viterbi decoder. The list Viterbi decoder includes a threshold determination unit configured to set a PMD threshold based on an input signal level and a PMD limit value. The list Viterbi decoder also includes a decoder configured to compare a PMD of a best path and the PMD threshold, and declare a decoding failure and ending decoding if the PMD is greater than or equal to the PMD threshold.

According to an embodiment of the present disclosure, a method is provided for operating a decoder. Decoding is performed to generate a code word with respect to a best path. It is determined whether the code word has an error. A decoding success is declared, when the code word does not have an error. When the code word has an error, it is determined whether an accumulated path metric difference (APMD) is less than an APMD threshold, a decoding failure is declared when the APMD is not less than the APMD threshold, decoding is performed to generate a next code word with respect to a next best path when the APMD is less than the APMD.

BRIEF DESCRIPTION OF THE DRAWINGS

The above and other aspects, features, and advantages of the present disclosure will be more apparent from the following detailed description when taken in conjunction with the accompanying drawings, in which.

DETAILED DESCRIPTION

Figure 1:
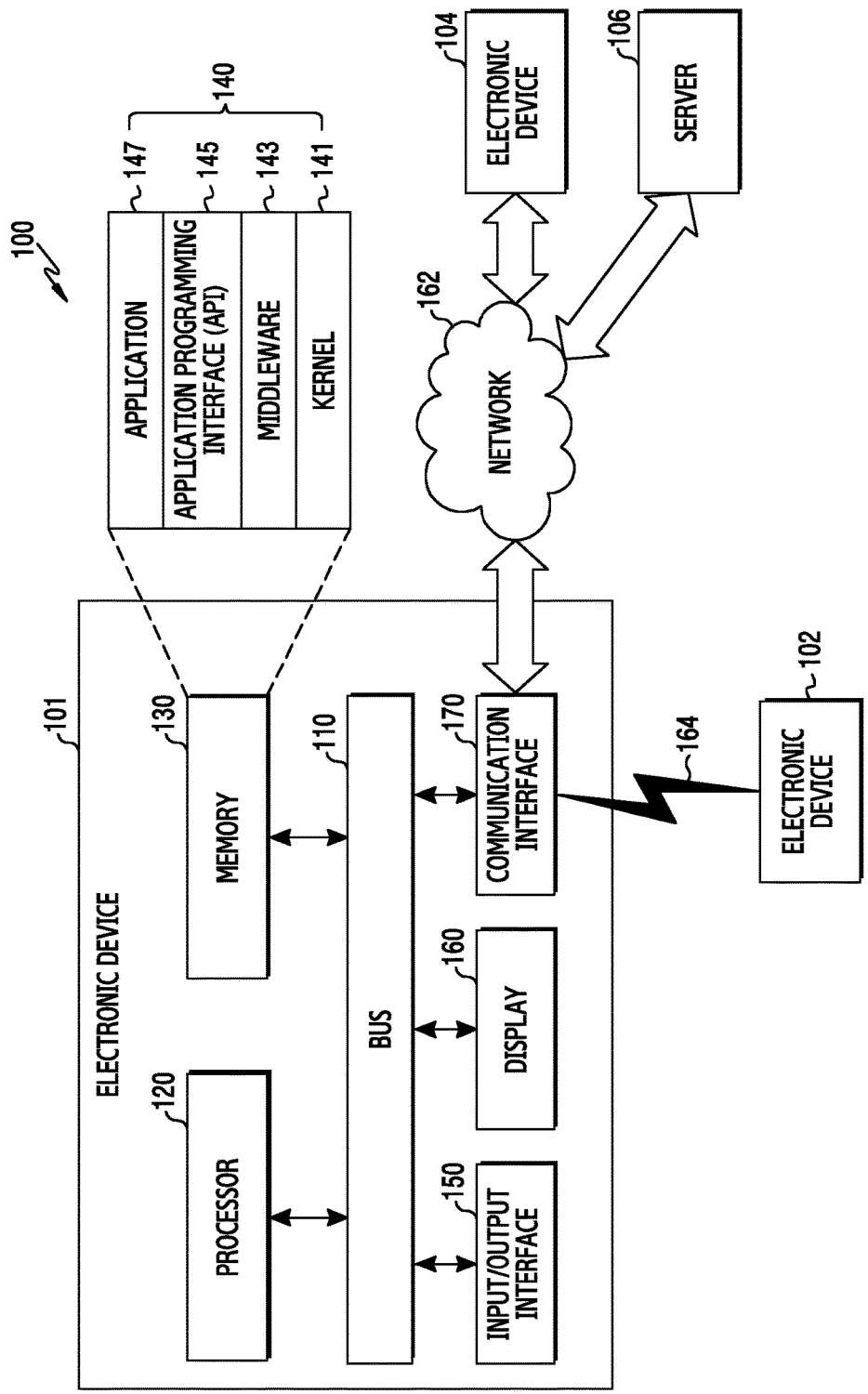
FIG. 1 is a diagram illustrating a network environment including an electronic device, according to an embodiment of the present disclosure.

Embodiments of the present disclosure are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the present disclosure.

The expressions "have", "may have", "include", and "may include", as used herein, are intended to indicate the presence of a corresponding characteristic (e.g., a number, a function, an operation, or an element such as a component), and it should be understood that there are additional possibilities of one or more other characteristics.

Herein, the expressions "A or B", "A and/or B", "at least one of A and B" and "one or more of A and B" may include all possible combinations of items enumerated together. For example, the expressions may indicate all cases where: (1) at least one A is included; (2) at least one B is included; and (3) at least one A and at least one B are both included.

Although expressions such as "$1^{st}$", "$2^{nd}$", "first", and "second" may be used to express various elements, they are not intended to limit the corresponding elements. The above expressions may be used to distinguish one element from another element. For example, a $1^{st}$ user device and a $2^{nd}$ user device are both user devices, and indicate different user devices. Additionally, a $1^{st}$ element may be referred to as a $2^{nd}$ element, and similarly, the $2^{nd}$ element may be referred to as the $1^{st}$ element without departing from the scope of the present disclosure.

When a certain element (e.g., the $1^{st}$ element) is described as being "operatively or communicatively coupled with/to" or "connected to" a different element (e.g., the $2^{nd}$ element), it is to be understood that the certain element is directly coupled with/to the different element or can be coupled with/to the different element via another element (e.g., a $3^{rd}$ element). When the certain element (e.g., the $1^{st}$ element) is described as being "directly coupled with/to" or "directly connected to" the different element (e.g., the $2^{nd}$ element), it may be understood that another element (e.g., the $3^{rd}$ element) is not present between the certain element and the different element.

The expression "configured to", as used herein, may be interchangeably used with, for example, "suitable for", "having the capacity to", "designed to", "adapted to", "made to", or "capable of", according to the situation. The expression "configured to" may not imply only "specially designed to" in a hardware manner. Instead, in a certain situation, "a device configured to" may imply that the device is "capable of" together with other devices or components. For example, "a processor configured to perform A, B, and C" may imply a dedicated processor (e.g., an embedded processor) for performing a corresponding operation, or a generic-purpose processor (e.g., a central processing unit (CPU) or an application processor (AP)) capable of performing corresponding operations by executing one or more software programs stored in a memory device.

Terms used herein are for the purpose of describing particular embodiments only and are not intended to limit other embodiments. A singular expression may include a plural expression unless there is a contextually distinctive difference. Unless otherwise defined, all terms (including technical and scientific terms) used herein have the same meanings as those commonly understood by those ordinarily skilled in the art to which embodiments of the present disclosure belong. It will be further understood that terms, such as those defined in commonly used dictionaries, should be interpreted as having meanings that are consistent with their meanings in the context of the relevant art, and will not be interpreted in an idealized or overly formal sense unless expressly so defined herein. In addition, the terms defined in the present document should not be interpreted to exclude embodiments of the present disclosure.

An electronic device, according to various embodiments of the present disclosure, may include, for example, at least one of a smart phone, a tablet personal computer (PC), a mobile phone, a video phone, an e-book reader, a desktop PC, a laptop PC, a netbook computer, a workstation, a server, a personal digital assistant (PDA), a portable multimedia player (PMP), a MPEG-1 audio layer 3 (MP3) player, a mobile medical device, a camera, and a wearable device (e.g., smart glasses, a head-mounted-device (HMD), electronic clothes, an electronic bracelet, an electronic necklace, an electronic appcessory, an electronic tattoo, or a smart watch).

According to embodiments of the present disclosure, the electronic device may be a smart home appliance. The smart home appliance may include, for example, at least one of a television (TV), a digital versatile disc (DVD) player, an audio player, a refrigerator, an air conditioner, a cleaner, an oven, a microwave oven, a washing machine, an air purifier, a set-top box, a home automation control panel, a security control panel, a TV box, a game console, an electronic dictionary, an electronic key, a camcorder, and an electronic picture frame.

According to other embodiments of the present disclosure, the electronic device may include at least one of various medical devices (e.g., various portable medical measuring devices (e.g., a blood sugar measuring device, a hear rate measuring device, a blood pressure measuring device, a body temperature measuring device, etc.), magnetic resonance angiography (MRA), magnetic resonance imaging (MRI), computed tomography (CT), imaging equipment, ultrasonic instrument, etc.)), a navigation device, a global positioning system (GPS) receiver, an event data recorder (EDR), a flight data recorder (FDR), a car infotainment device, an electronic equipment for ship (e.g., a vessel navigation device, a gyro compass, etc.), avionics, a security device, a car head unit, an industrial or domestic robot, an automated teller machine (ATM) of financial institutions, point of sales (POS) devices of shops, and IoT devices (e.g., a light bulb, various sensors, an electric or gas meter, a sprinkler device, a fire alarm, a thermostat, a streetlamp, a toaster, a fitness equipment, a hot water tank, a heater, a boiler, etc.)

According to embodiments of the present disclosure, the electronic device may include at least one of furniture or a part of building/constructions, an electronic board, an electronic signature input device, a projector, and various measurement machines (e.g., water supply, electricity, gas, propagation measurement machine, etc.). The electronic device may be one or more combinations of the aforementioned various devices. The electronic device may be a flexible device. Further, the electronic device is not limited to the aforementioned devices, and may include a new electronic device depending on the development of new technologies.

The term "user", as used herein, may refer to a person who uses the electronic device or a device which uses the electronic device (e.g., an artificial intelligence (AI) electronic device).

FIG. 1 is a diagram illustrating a network environment including an electronic device, according to an embodiment of the present disclosure.

Referring to FIG. 1, an electronic device 101 in a network environment 100 includes a bus 110, a processor 120, a memory 130, an input/output interface 150, a display 160, and a communication interface 170. The electronic device 101 may omit at least one of the aforementioned elements or may include additional elements.

The bus 110 may include a circuit for connecting, for example, the aforementioned elements 110 to 170 to each other and for delivering communication (e.g., a control message and/or data) between the aforementioned elements.

The processor 120 may include one or more of a CPU, an AP, and a communication processor (CP). The processor 120 may control, for example, at least one of the other elements of the electronic device 101 and/or may execute an arithmetic operation or data processing for communication. In particular, the processor 120 may control to receive $1^{st}$ proximity service data, and to receive $2^{nd}$ proximity service data by using guide information required to receive the $2^{nd}$ proximity service data included in the first proximity service data. Alternatively, the processor 120 may control to transmit the first proximity service data including the guide information required to receive the $2^{nd}$ proximity service data.

The memory 130 may include a volatile and/or non-volatile memory. The memory 130 may store, for example, an instruction or data related to at least one different element of the electronic device 101. The memory 130 may store software and/or a program 140. The program 140 includes, for example, a kernel 141, a middleware 143, an application programming interface (API) 145, an application program (or an "application") 147, or the like. At least one part of the kernel 141, middleware 143, or API 145 may be referred to as an operating system (OS).

The kernel 141 may control or manage, for example, system resources (e.g., the bus 110, the processor 120, the memory 130, etc.) used to execute an operation or a function implemented in other programs (e.g., the middleware 143, the API 145, or the application program 147). Further, the kernel 141 may provide an interface capable of controlling or managing the system resources by accessing individual elements of the electronic device 101 in the middleware 143, the API 145, or the application program 147.

The middleware 143 may perform, for example, a mediation role so that the API 145 or the application program 147 can communicate with the kernel 141 to exchange data. Further, regarding task requests received from the application program 147, the middleware 143 may perform, for example, a control (e.g., scheduling or load balancing) for the task request by using a method of assigning a priority capable of using the system resources (e.g., the bus 110, the processor 120, or the memory 130) of the electronic device 101 to at least one application among the application programs 147.

The API 145 may include, for example, at least one interface or function (e.g., instruction), for example, for file control, window control, video processing, or character control, as an interface capable of controlling a function provided by the application 147 in the kernel 141 or the middleware 143.

The input/output interface 150 may play a role of an interface capable of delivering, for example, an instruction or data input from a user or a different external device(s), to the different elements of the electronic device 101. Further, the input/output interface 150 may output an instruction or data received from a different element(s) of the electronic device 101 to the different external device.

The display 160 may be one of various types of displays, for example, a liquid crystal display (LCD), a light emitting diode (LED) display, an organic LED (OLED) display, a microelectromechanical systems (MEMS) display, or an electronic paper display. The display 160 may display, for example, a variety of content (e.g., text, image, video, icon, symbol, or the like) to the user. The display 160 may include a touch screen, and may receive a touch, gesture, proximity, or hovering input by using, for example, an electronic pen or a part of a user's body.

The communication interface 170 may establish, for example, communication between the electronic device 101 and the external device (e.g., a first external electronic device 102, a second external electronic device 104, or a server 106). For example, the communication interface 170 may communicate with the second external electronic device 104 or the server 106 by being connected with a network 162 through wireless communication or wired communication.

For example, as a cellular communication protocol, the wireless communication may include, for example, at least one of long term evolution (LTE), LTE-advanced (LTE-A), code division multiple access (CDMA), wideband CDMA (WCDMA), universal mobile telecommunications system (UMTS), wireless broadband (WiBro), global system for mobile communication (GSM), or the like. The wired communication may include, for example, at least one of universal serial bus (USB), high definition multimedia interface (HDMI), recommended standard (RS)-232, plain old telephone service (POTS), or the like. The network 162 may include, for example, at least one of a telecommunications network, a computer network (e.g., local area network (LAN) or wide area network (WAN)), the Internet, and a telephone network.

Each of the first and second external electronic devices 102 and 104 may be the same type of device as the electronic device 101 or may be a different type of device. The server 106 may include a group of one or more servers. All or some of the operations executed by the electronic device 101 may be executed in a different one or a plurality of electronic devices (e.g., the first external electronic device 102, the second external electronic device 104, or the server 106). If the electronic device 101 needs to perform a certain function or service either automatically or upon request, the electronic device 101 may request at least a part of the related functions related to a different electronic device (e.g., the first external electronic device 102. The second external electronic device 104, or the server 106) instead of executing the function or the service autonomously. The different electronic device may execute the requested function or additional function, and may deliver a result thereof to the electronic device 101. The electronic device 101 may provide the requested function or service either directly or by additionally processing the received result. Cloud computing, distributed computing, or client-server computing technique may be used.

Figure 2:
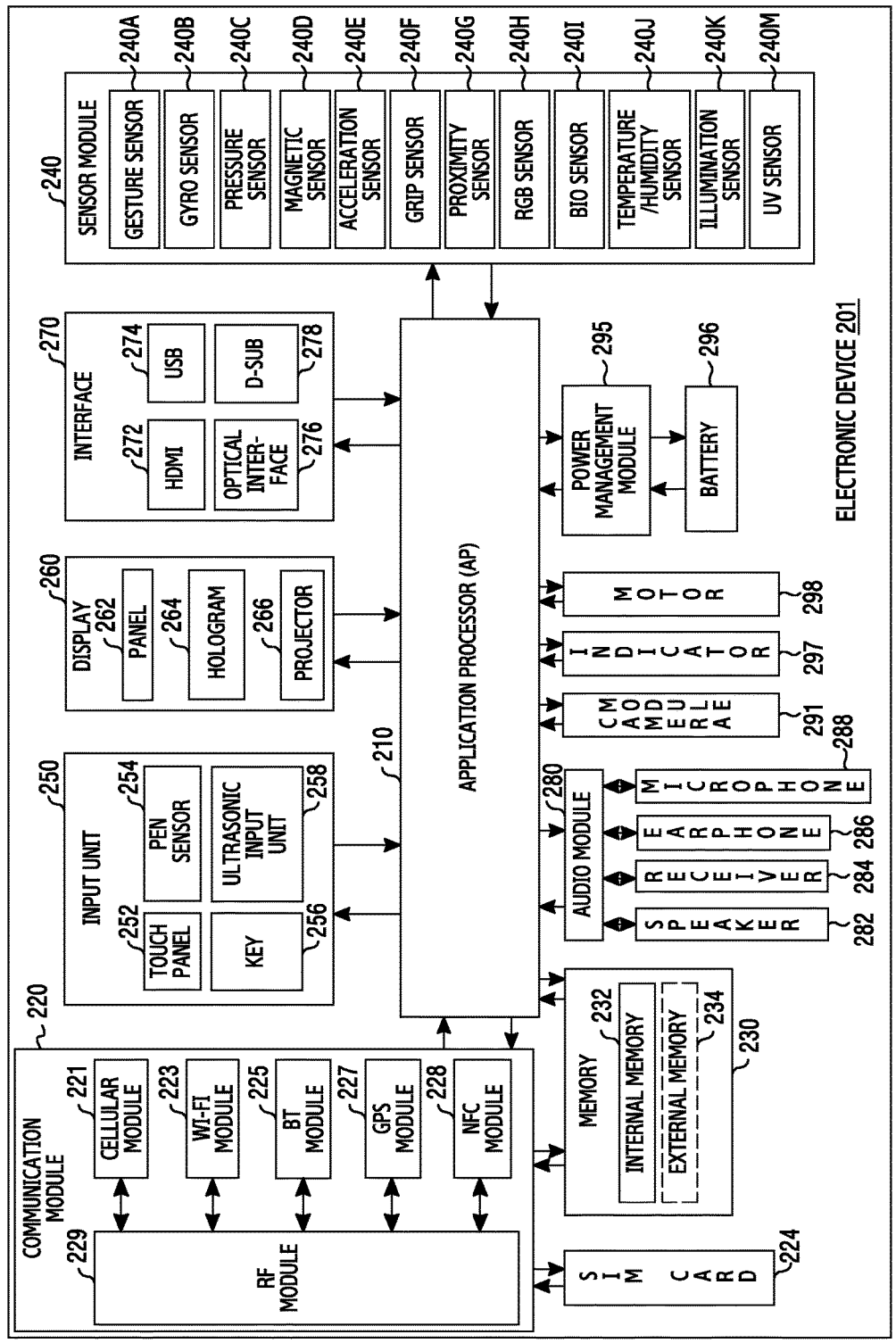
FIG. 2 is a diagram illustrating an electronic device, according to an embodiment of the present disclosure.

FIG. 2 is a diagram illustrating an electronic device, according to an embodiment of the present disclosure. An electronic device 201 includes, for example, all or some parts of the electronic device 101 of FIG. 1. The electronic device 201 includes one or more APs 210, a communication module 220, a subscriber identification module (SIM) card 224, a memory 230, a sensor module 240, an input unit 250, a display 260, an interface 270, an audio module 280, a camera module 291, a power management module 295, a battery 296, an indicator 297, and a motor 298.

The AP 210 may control a plurality of hardware or software elements connected to the AP 210 by driving, for example, an operating system or an application program, may process a variety of data including multimedia data, and may perform an arithmetic operation. The AP 210 may be implemented, for example, with a system on chip (SoC). The AP 210 may further include a graphic processing unit (GPU) and/or an image signal processor. The AP 210 may include at least one part (e.g., cellular module 221) of the aforementioned elements of FIG. 2. The AP 210 may process an instruction or data, which is received from at least one different element (e.g., a non-volatile memory), by loading it to a volatile memory, and may store a variety of data in the non-volatile memory.

The communication module 220 may have the same configuration as or a similar configuration to the communication interface 170 of FIG. 1. The communication module 220 includes, for example, the cellular module 221, a Wi-Fi module 223, a BlueTooth (BT) module 225, a global positioning system (GPS) module 227, a near field communication (NFC) module 228, and a radio frequency (RF) module 229. The communication module 220 provides a function of transmitting/receiving a signal. Therefore, the communication module 220 may be referred to as a receiver, a transmitter, a transceiver, a communication unit, or the like.

The cellular module 221 may provide a voice call, a video call, a text service, an Internet service, or the like, for example, through a communication network. The cellular module 221 may identify and authenticate the electronic device 201 in the communication network by using a SIM (e.g., the SIM card 224). The cellular module 221 may perform at least some functions that can be provided by the AP 210. According to an embodiment of the present disclosure, the cellular module 221 may include a CP.

Each of the WiFi module 223, the BT module 225, the GPS module 227, and the NFC module 228 may include, for example, a processor for processing data transmitted/received through a corresponding module. At least some (e.g., two or more) of the cellular module 221, the WiFi module 223, the BT module 225, the GPS module 227, and the NFC module 228 may be included in one integrated circuit (IC) or IC package.

The RF module 229 may transmit/receive, for example, a communication signal (e.g., an RF signal). The RF module 229 may include, for example, a transceiver, a power amp module (PAM), a frequency filter, a low noise amplifier (LNA), an antenna, or the like. According to another embodiment of the present disclosure, at least one of the cellular module 221, the WiFi module 223, the BT module 225, the GPS module 227, and the NFC module 228 may transmit/receive an RF signal via a separate RF module.

The SIM card 224 may include, for example, a card including a SIM and/or an embedded SIM, and may include unique identification information (e.g., an integrated circuit card identifier (ICCID)) or subscriber information (e.g., an international mobile subscriber identity (IMSI)).

The memory 230 (e.g., the memory 130) may include, for example, an internal memory 232 or an external memory 234. The internal memory 232 may include, for example, at least one of a volatile memory (e.g., a dynamic random access memory (RAM) ((DRAM)), a static RAM (SRAM), a synchronous DRAM (SDRAM), etc.) and a non-volatile memory (e.g., a one-time programmable read only memory (ROM) (OTPROM), a programmable ROM (PROM), an erasable and programmable ROM (EPROM), an electrically EROM (EEPROM), a mask ROM, a flash ROM, a flash memory (e.g., a NAND flash memory, a NOR flash memory, etc.), a hard drive, or a solid state drive (SSD)).

The external memory 234 may further include a flash drive, for example, compact flash (CF), secure digital (SD), Micro-SD, Mini-SD, extreme digital (xD), memory stick, or the like. The external memory 234 may be operatively and/or physically coupled to the electronic device 201 via various interfaces.

The sensor module 240 may measure, for example, a physical quantity or detect an operational status of the electronic device 201, and may convert the measured or detected information into an electric signal. The sensor module 240 includes, for example, at least one of a gesture sensor 240A, a gyro sensor 240B, a pressure sensor 240C, a magnetic sensor 240D, an acceleration sensor 240E, a grip sensor 240F, a proximity sensor 240G, a color sensor 240H (e.g., a red, green, blue (RGB) sensor), a bio sensor 240I, a temperature/humidity sensor 240J, an illumination sensor 240K, and an ultra violet (UV) sensor 240M. Additionally or alternatively, the sensor module 240 may include, for example, an e-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling at least one or more sensors included therein. The electronic device 201 may further include a processor configured to control the sensor module 204 either separately or as a part of the AP 210, and may control the sensor module 240 while the AP 210 is in a sleep state.

The input device 250 includes at least one of, for example, a touch panel 252, a (digital) pen sensor 254, a key 256, and an ultrasonic input unit 258. The touch panel 252 may recognize a touch input, for example, by using at least one of an electrostatic type, a pressure-sensitive type, and an ultrasonic type. The touch panel 252 may further include a control circuit. The touch penal 252 may further include a tactile layer, and thus, may provide the user with a tactile reaction.

The (digital) pen sensor 254 may be implemented, for example, by using the same method as or a similar method to receiving a touch input of the user or by using an additional sheet for recognition. The key 256 may be, for example, a physical button, an optical key, a keypad, or a touch key. The ultrasonic input unit 258 is a device by which the electronic device 201 detects a sound wave through a microphone 288 by using a pen which generates an ultrasonic signal.

The display 260 (e.g., the display 160 of FIG. 1) includes at least one of a panel 262, a hologram 264, and a projector 266. The panel 262 may include the same structure as or a similar structure to the display 160 of FIG. 1. The panel 262 may be implemented, for example, in a flexible, transparent, or wearable manner. The panel 262 may be constructed as one module with the touch panel 252. The hologram 264 may use an interference of light and show a stereoscopic image in the air. The projector 266 may display an image by projecting a light beam onto a screen. The screen may be located, for example, inside or outside the electronic device 201. The display 260 may further include a control circuit for controlling the panel 262, the hologram 264, or the projector 266.

The interface 270 includes at least one of, for example, an HDMI 272, a USB 274, an optical communication interface 276, or a D-subminiature (D-sub) 278. The interface 270 may be included, for example, in the communication interface 170 of FIG. 1. Additionally or alternatively, the interface 270 may include, for example, mobile high-definition link (MHL), SD/multi-media card (MMC), or infrared data association (IrDA).

The audio module 280 may bilaterally convert, for example, a sound and an electric signal. At least some elements of the audio module 208 may be included in, for example, the input/output interface 150 of FIG. 1. The audio module 280 may convert sound information which is input or output, for example, through a speaker 282, a receiver 284, an earphone 286, the microphone 288, or the like.

The camera module 291 is, for example, a device for image and video capturing, and may include one or more image sensors (e.g., a front sensor or a rear sensor), a lens, an image signal processor (ISP), or a flash (e.g., LED or xenon lamp).

The power management module 295 may manage, for example, power of the electronic device 201. The power management module 295 may include a power management IC (PMIC), a charger IC, or a battery gauge. The PMIC may have a wired and/or wireless charging type. The wireless charging type may include, for example, a magnetic resonance type, a magnetic induction type, an electromagnetic type, or the like, and may further include an additional circuit for wireless charging, for example, a coil loop, a resonant circuit, a rectifier, or the like. The battery gauge may measure, for example, residual quantity of the battery 296 and voltage, current, and temperature during charging. The battery 296 may include, for example, a rechargeable battery and/or a solar battery.

The indicator 297 may indicate a specific state, for example, a booting state, a message state, a charging state, or the like, of the electronic device 201 or a part thereof (e.g., the AP 210). The motor 298 may convert an electric signal into a mechanical vibration, and may generate a vibration or haptic effect. The electronic device 201 may include a processing unit (e.g., a GPU) for supporting a mobile TV. The processing unit for supporting the mobile TV may process media data according to a protocol of, for example, digital multimedia broadcasting (DMB), digital video broadcasting (DVB), media flow, or the like.

Each of the aforementioned elements of the electronic device may consist of one or more components, and names thereof may vary depending on a type of the electronic device. The electronic device, according to various embodiments of the present disclosure, may include at least one of the aforementioned elements. Some of the elements may be omitted, or additional elements may be included. Further, some of the elements of the electronic device may be combined and constructed as one entity, so as to equally perform functions of corresponding elements before combination.

Figure 3:
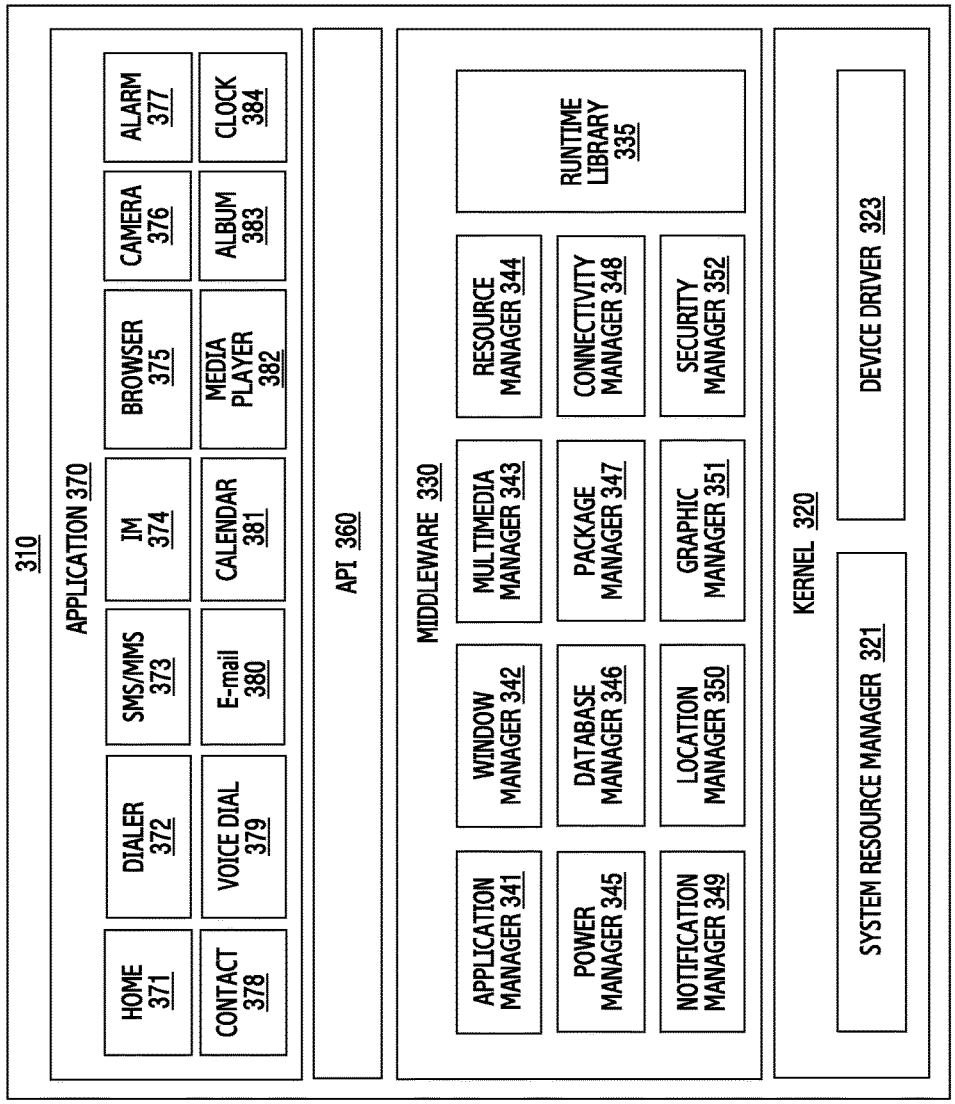
FIG. 3 is a diagram illustrating a program module, according to an embodiment of the present disclosure.

FIG. 3 is a block diagram of a program module, according to an embodiment of the present disclosure. A program module 310 (e.g., the program 140 of FIG. 1) includes an OS for controlling a resource related to an electronic device (e.g., the electronic device 101 of FIG. 1) or various applications (e.g., the application 147 of FIG. 1) driven on the OS.

The programming module 310 includes a kernel 320, a middleware 330, an API 360, and an application 370. At least one part of the program module 310 can be preloaded on the electronic device, or can be downloaded from a server 106 of FIG. 0.1.

The kernel 320 (e.g., the kernel 141 of FIG. 1) includes, for example, a system resource manager 321 or a device driver 323. The system resource manager 321 may perform control, allocation, retrieval, or the like of the system resource. The system resource manager 321 may include a process managing unit, a memory managing unit, a file system managing unit, or the like. The device driver 323 may include, for example, a display driver, a camera driver, a BT driver, a shared memory driver, a USB driver, a keypad driver, a WiFi driver, an audio driver, or an inter-process communication (IPC) driver.

The middleware 330 may provide, for example, a function commonly required by the application 370, or may provide various functions through the API 360 so that the application 370 can effectively use a limited system resource in the electronic device. The middleware 330 includes at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include, for example, a library module used by a compiler to add a new function through a programming language while the application 370 is executed. The runtime library 335 may perform an operation of an input/output management, a memory management, an arithmetic function, or the like.

The application manager 341 may manage, for example, a life cycle of at least one application among the applications 370. The window manager 342 may manage a graphic user interface (GUI) resource used in a screen. The multimedia manager 343 may recognize a format required to reproduce various media files, and may use a codec suitable for the format to perform encoding or decoding of the media file. The resource manager 344 may manage a resource (e.g., a source code, a memory, a storage space, etc.) of at least any one of the applications 370.

The power manager 345 may manage, for example, a battery or power by operating together with a basic input/output system (BIOS), or the like, and may provide power information or the like required for the operation. The database manager 346 may manage to generate, search, or change a database to be used in at least one application among the applications 370. The package manager 347 may manage an installation or update of an application distributed in a form of a package file.

The connectivity manager 348 may manage, for example, a wireless connection such as WiFi, BT, or the like. The notification manager 349 may display or notify an event such as an incoming message, an appointment, a proximity notification, or the like, in a manner so as not to disturb the user. The location manager 350 may manage location information of the electronic device. The graphic manager 351 may manage a graphic effect to be provided to the user or a user interface related thereto. The security manager 352 may provide a general security function required for system security, user authentication, or the like. According to an embodiment of the present disclosure, if the electronic device includes a telephone function, the middleware 330 may further include a telephony manager for managing a voice or video telephony function of the electronic device.

The middleware 330 may include a middleware module for forming a combination of various functions of the aforementioned elements. The middleware 330 may provide a module specified for each type of operating system to provide a differentiated function. The middleware 330 may dynamically delete some of the existing elements or may add new elements.

The API 360 (or, the API 145) is, for example, a set of API programming functions, and may be provided with other configurations according to an OS. For example, one API set may be provided for each platform, or two or more API sets may be provided.

The application 370 (or, the application program 147) may include one or more applications capable of providing a function of, for example, a home 371, a dialer 372, a short message service (SMS)/multimedia messaging service (MMS) 373, an instant message (IM) 374, a browser 375, a camera 376, an alarm 377, a contact 378, a voice dial 379, an e-mail 380, a calendar 381, a media player 382, an album 383, a clock 384, a health care (e.g., an application for measuring a physical activity level, a blood sugar level, etc.), or providing of environment information (e.g., providing of atmospheric pressure, humidity, or temperature information).

According to an embodiment of the present disclosure, the application 370 may include an "information exchange application" for supporting information exchange between the electronic device and an external electronic device. The information exchange application may include, for example, a notification relay application for relaying specific information to the external electronic device or a device management application for managing the external electronic device.

For example, the notification relay application may include a function of relaying notification information generated in another application (e.g., an SMS/MMS application, an e-mail application, a health care application, an environment information application, etc.) of the electronic device to the external electronic device 202 or 204. Further, the notification relay application may receive notification information, for example, from the external electronic device and may provide it to the user. The device management application may manage (e.g., install, delete, or update), for example, at least one function (e.g., turning on/turning off the external electronic device itself (or some components thereof) or adjusting of a display illumination (or a resolution)) of an external electronic device that communicates with the electronic device, an application that operates in the external electronic device, or a service (e.g., a call service or a message service) provided by the external electronic device.

According to an embodiment of the present disclosure, the application 370 may include an application specified according to an attribute (e.g., as an attribute of the electronic device, a type of the electronic device is a mobile medical device) of the external electronic device 102 or 104. The application 370 may include an application received from the external electronic device (e.g., the server 106, the first external electronic device 102, or the second external electronic device 104). The application 370 may include a preloaded application or a third party application that can be downloaded from the server. A name of elements of the program module 310 according to the illustrated embodiment may differ depending on an OS type.

According to an embodiment of the present disclosure, at least a part of the program module 310 may be implemented in software, firmware, hardware, or at least two or more of combinations thereof. At least some parts of the programming module 310 may be implemented (e.g., executed), for example, by a processor (e.g., the AP 210). At least some parts of the programming module 310 may include, for example, modules, programs, routines, sets of instructions, processes, or the like for performing one or more functions.

The term "module", as used herein, may refer to a unit including, for example, one of hardware, software, firmware, or a combination of two or more of them. The term "module" may be interchangeably used with terms such as "unit", "logic", "logical block", "component", "circuit", or the like. A module may be a minimum unit of an integrally constituted component or may be a part thereof. A module may be a minimum unit for performing one or more functions or may be a part thereof. A module may be mechanically or electrically implemented. For example, a module of the present disclosure may include at least one of an application-specific IC (ASIC) chip, a field-programmable gate array (FPGA), and a programmable-logic device, which are known or will be developed and which perform certain operations.

At least some parts of a device (e.g., modules or functions thereof) or method (e.g., operations) may be implemented with an instruction stored in a computer-readable storage media. If the instruction is executed by one or more processors (e.g., the processor 120 of FIG. 1), the one or more processors may perform a function corresponding to the instruction. The computer-readable storage media may be, for example, the memory 130.

The computer readable recording medium may include a hard disk, a floppy disk, magnetic media (e.g., a magnetic tape), optical media (e.g., a compact disc-ROM (CD-ROM), a DVD, magnetic-optic media (e.g., a floptical disk)), a hardware device (e.g., a ROM, a RAM, a flash memory, or the like), or the like. An example of the program instruction includes not only a machine language created by a compiler but also a high-level language executable by a computer by using an interpreter or the like. The aforementioned hardware device may be configured to operate as one or more software modules to perform the operation of the present disclosure, and the other way around is also possible.

The module or programming module may further include at least one or more elements among the aforementioned elements, may omit some of elements, or may include additional elements. Operations performed by a module, programming module, or other elements may be executed in a sequential, parallel, repetitive, or heuristic manner. Further, some of the operations may be executed in a different order or may be omitted, or other operations may be added.

Figure 4:
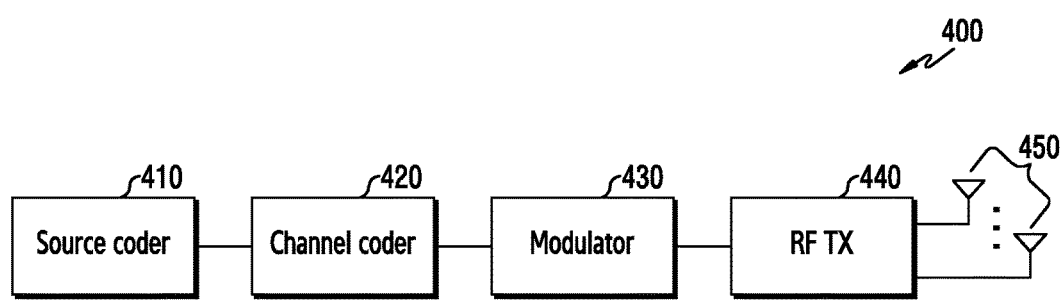
FIG. 4 is a diagram illustrating a structure of a transmitter for transmitting a radio signal of an electronic device, according to an embodiment of the present disclosure.

FIG. 4 is a diagram illustrating a structure of a transmitter for transmitting a radio signal of an electronic device, according to an embodiment of the present disclosure. The transmitter may be included in the communication interface 170 of FIG. 1.

Referring to FIG. 4, the transmitter includes a source coder 410, a channel coder 420, a modulator 430, an RF transmitter (TX) 440, and an antenna 450.

The source coder 410 may perform source coding on input original data. The source coder 410 may perform encoding to decease a size of the original data so that the data can be easily stored and communicated. The data may be voice, video, or a plurality of pieces of data. Additionally, examples of the source coder 410 may include a plurality of coders the types of which correspond to respective data types. For example, in case of voice data, the source coder 410 may be a coder of a Qualcomm code-excited linear prediction (QCELP), adaptive multi-rate narrowband (AMR-NB), or adaptive multi-rate wideband (AMR-WB) type.

The channel coder 420 may perform channel coding on input data in order to decrease an error on fading or noise generated in a communication environment. The channel coder 420 may perform the channel coding for each channel. Herein, the channel may be a traffic channel for transmitting voice or data, a control channel for transmitting control data, or the like. The channel coder 420 may be a convolutional coder. Further, the channel coder 420 may perform the channel coding in one unit of transmission. The unit of transmission may be referred to differently according to a communication system. The channel coder 420 may output a symbol corresponding to an input bit on the basis of a code rate. For example, if the code rate is 1/3, the number of symbols output from the channel coder 420 may be three times the number of input bits.

The modulator 430 may perform modulation based on a modulation scheme according to the communication system. For example, the modulator 430 may be a modulator of a CDMA type, a WCDMA type, an orthogonal type (e.g., orthogonal frequency division multiplexing (OFDM)), a non-orthogonal type (e.g., filter bank multi-carrier (FBMC)), or the like.

The RF TX 440 may up-convert a modulated transmission signal into an RF signal. Further, the RF TX 440 may amplify transmission power of the signal.

The antenna 450 may include one or more antennas. Further, the antenna 450 may be configured to be suitable for a multi input multi output (MIMO) scheme.

Figure 5:
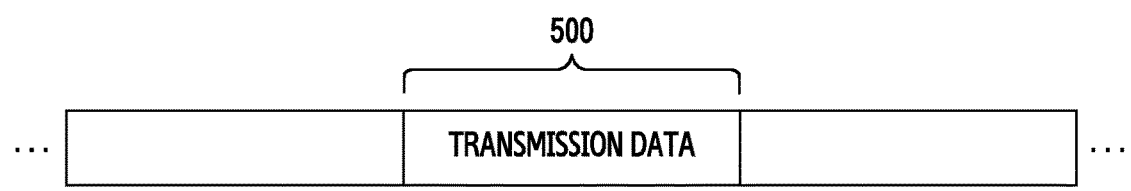
FIG. 5 is a diagram illustrating a single transmission data unit that is subjected to channel coding in a channel coder, according to an embodiment of the present disclosure.

FIG. 5 is a diagram illustrating a single transmission data unit that is subjected to channel coding in a channel coder, according to an embodiment of the present disclosure. Referring to FIG. 5, transmission data 500 may be output from the channel coder 420 of FIG. 0.4. For example, a convolution encoder may generate n code words as to k inputs. In this case, a code rate may be k/n. Herein, the code word (i.e., coded data, symbol) may also be determined by not only the k inputs but also a constraint length K. The constraint length may imply the total number of inputs that are involved in an output. Further, the constraint length may also imply a total size of a memory for storing data having an effect thereon. For example, if the number of registers is m, the constraint length K may be m+1 (i.e., K=m+1). That is, if the constraint length K is 7 (i.e., K=7), this may imply that a convolution is performed using a 6-bit register and 1-bit input data. Therefore, a convolution encoder having a code rate 1/M may generate an M-bit code word by receiving the 1-bit data as an input. Further, such an operation may be performed by performing time-convolution on input information data using a generating function.

Figure 6:
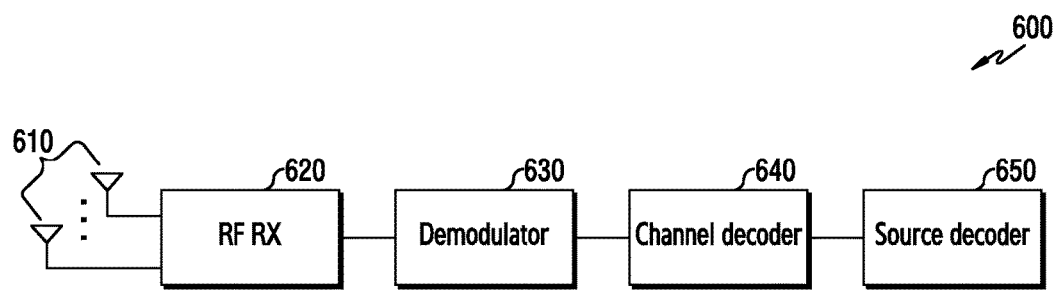
FIG. 6 is a diagram illustrating a structure of a receiver, according to an embodiment of the present disclosure.

FIG. 6 is a diagram illustrating a structure of a receiver, according to an embodiment of the present disclosure. The receiver may be included in the communication interface 170 of FIG. 1.

Referring to FIG. 6, a receiver 600 includes an antenna 610, an RF receiver (RX) 620, a demodulator 630, a channel decoder 640, and a source decoder 650.

The antenna 610 may include one or more antennas. Further, the antenna 610 may be configured to be suitable for a MIMO scheme. Furthermore, the antenna 610 may receive a signal from a transmitter (e.g., the transmitter 400).

The RF receiver 620 may amplify a received RF signal with a low noise and thereafter may down-convert the signal into a baseband signal.

The demodulator 630 may demodulate a received signal in accordance with a modulation scheme (e.g., a CDMA type, a WCDMA type, an orthogonal type (e.g., OFDM), a non-orthogonal type (e.g., FBMC), or the like.).

The channel decoder 640 may perform channel decoding for each channel. Further, the channel decoder 640 may perform the channel decoding in units of data corresponding to the unit of transmission. The channel decoder 640 may be an LVD.

The source decoder 650 may decode modulated source data (or source coded data, i.e., channel decoded reception data). The source decoder 650 may be a decoder of a data type corresponding to the source coder 410.

A Viterbi decoder algorithm is a maximum likelihood algorithm for finding a transmitted code word by finding a best path having a maximum accumulated path metric (APM) value on a trellis from a received signal. That is, the Viterbi decoder algorithm may be an algorithm for finding a code word closest in distance to the received signal. The APM value may be summarized based on an equation for calculating a distance between the received signal and code words. The APM may be a value indicating a close relation to the distance between the received signal and the code word.

An error detecting block, such as, for example, CRC, may be added to a last stage of the LVD, thereby improving decoding performance using the LVD. The LVD uses an algorithm for determining the number of candidate groups of code words, for finding a determined number of code words closest to a best path, and finding an error-free code word through the error detector. That is, the LVD uses an algorithm for extending a distance from the code word having the best path, so that the number of candidate groups to be included is the same as the number of lists. The LVD may include an error detector, such as, for example, a cyclic redundancy check (hereinafter, CRC), in a last stage thereof to detect an error. If the error detector is able to detect all possible errors, a performance gain can be increased to the maximum extent possible without a false alarm. However, reliability may change according to the CRC in use. When the CRC has a short parity bit length, the reliability is decreased, thereby increasing the false alarm.

Additionally, if decoding is attempted in a state where there is no signal, or if decoding is attempted for a signal of another user, the false alarm may be significantly increased by the LVD. According to an embodiment of the present disclosure, an electronic device or a system using an LVD can reduce a decoding error by increasing a code word candidate group in number by a given list count. More specifically, for example, the electronic device may manage code words of which an APM value is most similar to a best path as a list candidate group. The electronic device may determine a difference of a path metric value of candidate groups with respect to the best path, and may determine candidate groups having a smallest path metric difference. A performance gain is expected mostly in an initial list count in case of the LVD, and the performance gain is converged by being gradually decreased as the list count is increased. Further, a PMD with respect to a best path is gradually increased when the list count is increased. That is, since a distance between a code word having the best path and a code word of candidate groups is gradually increased, a false alarm may be increased. According to an embodiment of the present disclosure, an apparatus and a method are provided that are capable of maintaining decoding performance while reducing decoding error caused by an incorrect code word by restricting the aforementioned PMD.

The LVD restricts the PMD with respect to the best path when selecting a candidate group of code words by the list count. An average value of a list Viterbi input signal may be used as a value that is set to restrict a path difference. In addition, in the LVD, if the PMD is greater than a pre-set threshold, a decoding operation may end and this may be handled as a decoding error.

Accordingly, embodiments of the present disclosure are characterized in that, when the LVD is used, there is a restriction when a code word is intended to belong to a code word candidate group, even if a list count does not reach a pre-determined maximum value. Accordingly, an increase in false alarms can be prevented while maintaining performance of the LVD.

The channel decoder 640 of FIG. 6 may include an LVD and a CRC checker. A decoding result of the LVD may be linked to the CRC checker. The LVD may have various forms such as, for example, a parallel LVD, a serial LVD, or the like. It is assumed herein that the LVD is the serial LVD, but this is merely for description and not for limitation.

Figure 7A:
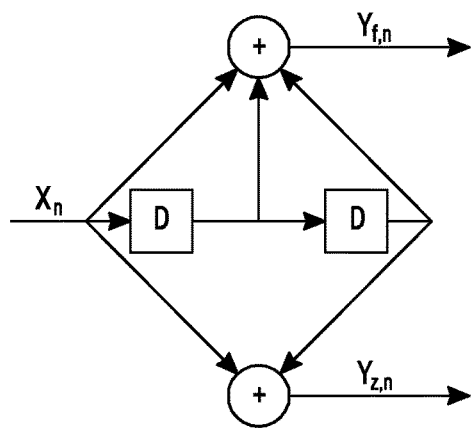
FIGS. 7A-7C are diagrams illustrating a convolution encoding method and a method of generating a decoding path corresponding thereto, according to an embodiment of the present disclosure.
Figure 7B:
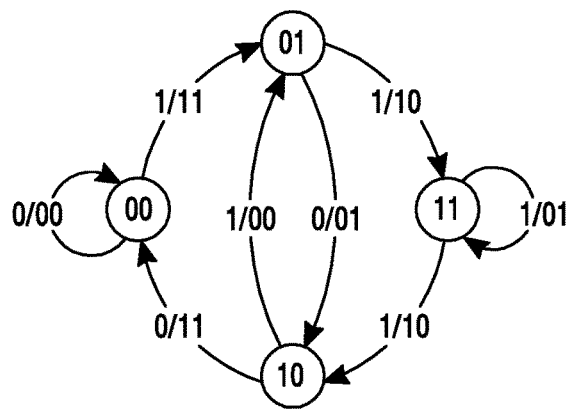
Figure 7C:
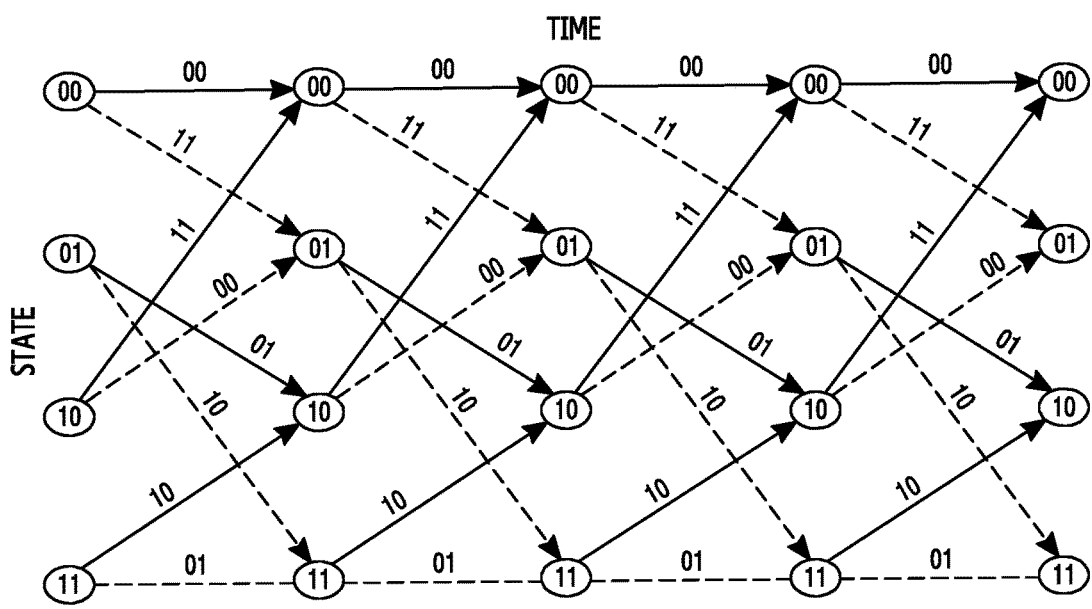

FIGS. 7A-7C are diagrams illustrating a convolution encoding method and a method of generating a decoding path corresponding thereto, according to an embodiment of the present disclosure. A convolution encoder may perform coding on signals by using a convolutional coding system. The convolutional code is characterized in that it is handled in a coding process by additionally using previously input bits. Therefore, a coder may be one type of a finite state machine. An example of one type of convolution code that can be used in the coder is shown in FIG. 7A. As shown in a coder block diagram, coding in this unit is dependent on not only a state $X_n$ of a current input bit, but also a state of two previous input bits maintained in two latches D. As a result, the coder may be a 4-state machine, as shown in a state diagram of FIG. 7B. A trellis of a coder shown in FIG. 7C may be derived from the above state diagram. Herein, a branch corresponding to a specific state corresponding to an input value 0 may be indicated by a solid line arrow, and a branch corresponding to a specific state corresponding to an input value 1 may be indicated by a dotted line arrow. The coding process may be apparent to those ordinarily skilled in the art according to the trellis of FIG. 7C.

Figure 8:
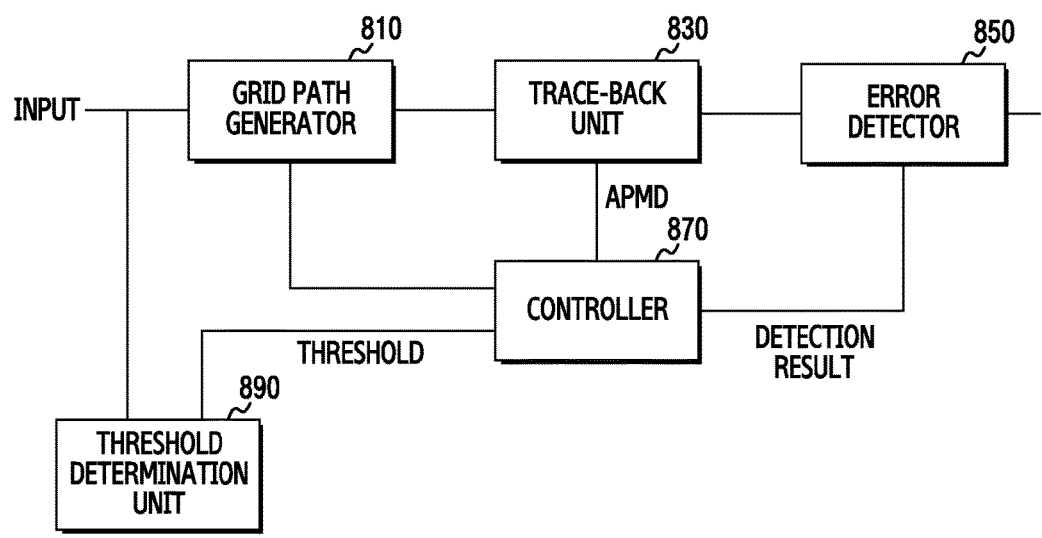
FIG. 8 is a diagram illustrating a structure of a channel decoder in a wireless communication system, according to an embodiment of the present disclosure.

FIG. 8 is a diagram illustrating a structure of a channel decoder in a wireless communication system, according to an embodiment of the present disclosure.

A detailed operating method of a grid path generator 810 and a trace-back unit 830 of FIG. 8 is set forth below. For all paths that enter a current state, the grid path generator 810 may calculate an accumulative path metric value which transitions from a previous state of the path to the current state of the path. The grid path generator 810 may determine a path having a best accumulative path metric value as a survival path, and thereafter, may store a survival path accumulative matrix value.

The trace-back unit 830 may use a trace-back table to store a path when transitioning from the previous state to the current state. The trace-back unit 830 may trace back from a state having an optimal path accumulative metric value in a last state of a grid to determine a most similar path, i.e., a best path. Additionally, the trace-back unit 830 may output a code word corresponding to the determined best path. Herein, a first generated most similar path may be referred to as a first best path. Further, in a trace-back process for generating the first best path, the trace-back unit 830 may calculate an accumulated PMD (hereinafter, APMD) in each node of the best path, and may determine a node having a smallest APMD among them and a minimum APMD. If an error is detected from data decoded in an error detection process, the minimum APMD and the node having that value may be utilized as basis data for generating a next-priority best path, such as a second best path, a third best path, or the like. In addition, the trace-back unit 830 may transmit the APMD to a controller 870. The trace-back unit 830 may output a first code word (i.e., a first decoding result) through a trace-back of the first best path. To determine an error of the decoding result, the trace-back unit 830 may transmit the first code word to an error detector 850.

The error detector 850 may detect a decoding result, that is, whether there is an error in a decoded code word. For example, the error detector 850 may receive a decoding result corresponding to the first best path, and may determine whether there is an error. In addition, the error determination result may be transmitted to the controller 870. The error detector may be CRC. According to an embodiment of the present disclosure, if it is determined that there is no error in the decoding result, the decoded 1$^{st}$ code word may be accepted, and the decoding may end.

The controller 870 may receive an error detection result from the error detector 850. If an error is detected in the decoding result, the controller 870 may determine whether there is a need to generate a next-priority best path.

In order to determine whether there is a need to generate the next-priority best path, the controller 870 may determine a list count. If a variable that indicates the list count is denoted by L, a best path to be generated and a code word list (i.e., a decoding result) corresponding thereto may be increased whenever L is incremented by 1. According to an embodiment of the present disclosure, an initial value of L may be set to 0, and this may correspond to the first best path and the first code word corresponding thereto. Further, L is incremented by 1 to generate the second best path, which may result in L=1. L is further incremented by 1 to generate the third best path, which may result in L=2. The controller 870 may determine the list count, and thus, may determine whether the list count exceeds a pre-set maximum value $L_{MAX}$. If the list count exceeds $L_{MAX}$, the controller 870 may declare a decoding failure without having to generate the best path any longer. This is because a performance gain may be expected mostly in an initial list count in case of the LVD, and the performance gain may be converged by being gradually decreased as the list count is increased. Further, a PMD with respect to a most similar path may be gradually increased when the list count is increased. Since a distance between the most similar path, i.e., a code word having the first best path, and a code word of candidate groups is gradually increased, a false alarm may be increased. If $L_{MAX}=2$, since the second best path corresponds to L=1, the controller 870 may determine that the list count does not exceed a pre-set maximum value 2.

Further, in order to determine whether there is a need to generate the next-priority best path, the controller 870 may determine whether a condition of APMD<thr$_{APMD}$ is satisfied. More specifically, the controller 870 may compare the APMD value at each node of the first best path and received from the trace-back unit 830 and thr$_{APMD}$ received from a threshold determination unit 890. Herein, the threshold determination unit 890 may determine thr$_{APMD}$. According to an embodiment of the present disclosure, thr$_{APMD}$ may be determined by a product between an average input signal level and a path metric difference limit value (hereinafter, PMD$_{limit}$). However, this is not for restricting a method of determining thr$_{APMD}$ but for exemplary purposes only. More specifically, the threshold determination unit 890 may determine an average input signal level $I_{in}$ of a received signal. This is to determine thr$_{APMD}$ by the threshold determination unit 890 by utilizing the average value of the input signal level since the path metric may vary depending on the level of the input signal. The average input signal level $I_{in}$ may be expressed by Equation (1) below.

$$\frac{1}{m}\sum_{n=1}^{m} a_n = I_{in} \tag{1}$$

In Equation (1), $a_n$ may indicate an input signal value, and m may indicate a code word length. Further, the threshold determination unit 890 may determine PMD$_{limit}$. According to an embodiment of the present disclosure, a case where all input signals have a value 'a' and there is no error may be assumed. That is, it is assumed that all values $a_n$ have the value 'a'. If the code word length is m and a code rate is 1/3, and if there is no code word or no tail part that is a condition of ending a trellis, then APM may have a value 3×m×a.

According to another embodiment, if only one symbol has an error in the input signal, the APM may be 3×a×(m−1)+ a=3×a×m−2a. In the same manner, when k symbols have an error, the APM may be indicated by Equation (2) below.

$$3 \times a \times m - 2 \times a \times k \quad (2)$$

Accordingly, only a case where k symbols have an error in a code word corresponding to a $1^{st}$ best path may be considered as a list candidate, and in this case, the LVD needs to consider only a case where a PMD value is less than or equal to 2×a×k. Herein, 2×a×k may be $PMD_{limit}$. As a result, $thr_{APMD}$ may be expressed by Equation (3) below.

$$thr_{APMD} = I_{in} \times PMD_{limit} \quad (3)$$

For example, in order to determine whether to generate the second best path, the controller 870 may determine an APMD value of a node having a smallest APMD value among respective nodes of the first best path as a first APMD value. In addition, the controller 870 may compare the first APMD value with $thr_{APMD}$. In another example, in order to determine whether to generate the $3^{rd}$ best path, the controller 870 may determine an APMD value of a node having a second smallest APMD value among respective nodes of the first best path as a second APMD value, and may compare the second APMD value with $thr_{APMD}$. If the comparison result is $APMD > thr_{APMD}$, the controller 870 may declare a decoding failure without having to generate an additional best path. This is because the APM value is a value indicating a close relation to a distance between a received signal and a code word. An increase in the APMD leads to a growing increase in a most similar path, i.e., a distance between the first code word corresponding to the first best path and a code word of candidate groups, and thus, a false alarm may be increased. Therefore, even if $L=L_{max}$ is not satisfied, that is, even if the list count does not reach a maximum value, in case of $APMD > thr_{APMD}$, the controller 870 may not generate a new decoding path but declare a decoding failure.

Otherwise, if $APMD < thr_{APMD}$ (here, L must not exceed $L_{max}$), the controller 870 may transmit to the grid path generator 810 a control signal for generating a new best path for decoding according to the node. For example, if first $APMD < thr_{APMD}$, the controller 870 may determine to generate the second best path, and may deliver this to the grid path generator 810. In another example, when an error is detected in a decoding result corresponding to the second best path, if a condition of second $APMD < thr_{APMD}$ is satisfied, the controller 870 may determine to generate the $3^{rd}$ best path, and may deliver this to the grid path generator 810. However, in the above example, the list count L must not exceed a pre-set maximum value $L_{max}$.

As a result, if the list count L does not exceed $L_{max}$ and satisfies the condition of $APMD < thr_{APMD}$, the controller 870 may transmit, to the grid path generator 810, a control signal for generating a new path. According to an embodiment of the present disclosure, if the list count does not exceed the pre-set maximum value $L_{max}$ and satisfies the condition of $1^{st}$ $APMD < thr_{APMD}$, the controller 870 may transmit to the grid path generator 810 a control signal for generating the second best path. To generate the second best path, the grid path generator 810 may generate a new path by selecting a path different from the first best path between the two types of paths in a node of the first best path corresponding to the first APMD value. The newly generated path may be the second best path. In addition, the trace-back unit 830 may decode a second code word corresponding to the second best path, and the error detector 850 may detect whether the second code word has an error. An increase in a false alarm may be controlled by decoding a received signal through the aforementioned process.

As described above, a serial code word candidate group list is generated in such a manner that a second code word is generated, and thereafter a third code word is generated. However, the code word candidate group list, such as the second code word, the third code word, and the like, may be generated in parallel (simultaneously). In this case, it may be detected whether there is an error in the code word candidate groups generated in parallel, and a code word corresponding to a best path having a smallest APMD value may be determined among error-free code words.

According to an embodiment of the present disclosure, the grid path generator 810, the trace-back unit 830, and the controller 870 may be constructed of one chip to constitute a decoder, and the decoder may be combined with the threshold determination unit 890 to constitute the LVD. Additionally, the LVD may be electrically coupled to the error detector 850 to constitute an LVD apparatus.

In a channel decoder having the structure of FIG. 8, the APM may change depending on an input signal level. An increase in an average input signal level, which is output from the threshold determination unit 890, results in an increase in the APM value. A decrease in the average input signal level results in a decrease in the APM value. In general, a noise may be included in a signal that is input to the LVD. Therefore, the input signal level may not be constant and the threshold determination unit 890 may measure the average input signal level to obtain a representative value. Herein, there may be an electronic device or system that has difficulty in obtaining the average input signal level. In this case, the threshold determination unit 890 may determine the average input signal by using various methods, such as, for example, an average for some signals or a representative value or the like operating in the electronic device or the system.

Further, the LVD may have the $PMD_{limit}$ value. Additionally, the LVD may calculate $thr_{APMD}$ by using the $PMD_{limit}$ value and the average input signal level output from the threshold determination unit 890, and thus, may restrict an operating range of the LVD. Furthermore, the threshold determination unit 890 may directly set and use the $thr_{APMD}$ value.

The LVD may perform the decoding operation by the list count, and may exclude a candidate group from a decoding result by using the $thr_{APMD}$. Further, if it is determined that the decoding result has no error after fully operating the LVD, the LVD may compare the PMD value of the code word with $thr_{APMD}$, and if the PMD value is greater than $thr_{APMD}$, may declare a decoding failure.

Figure 9:
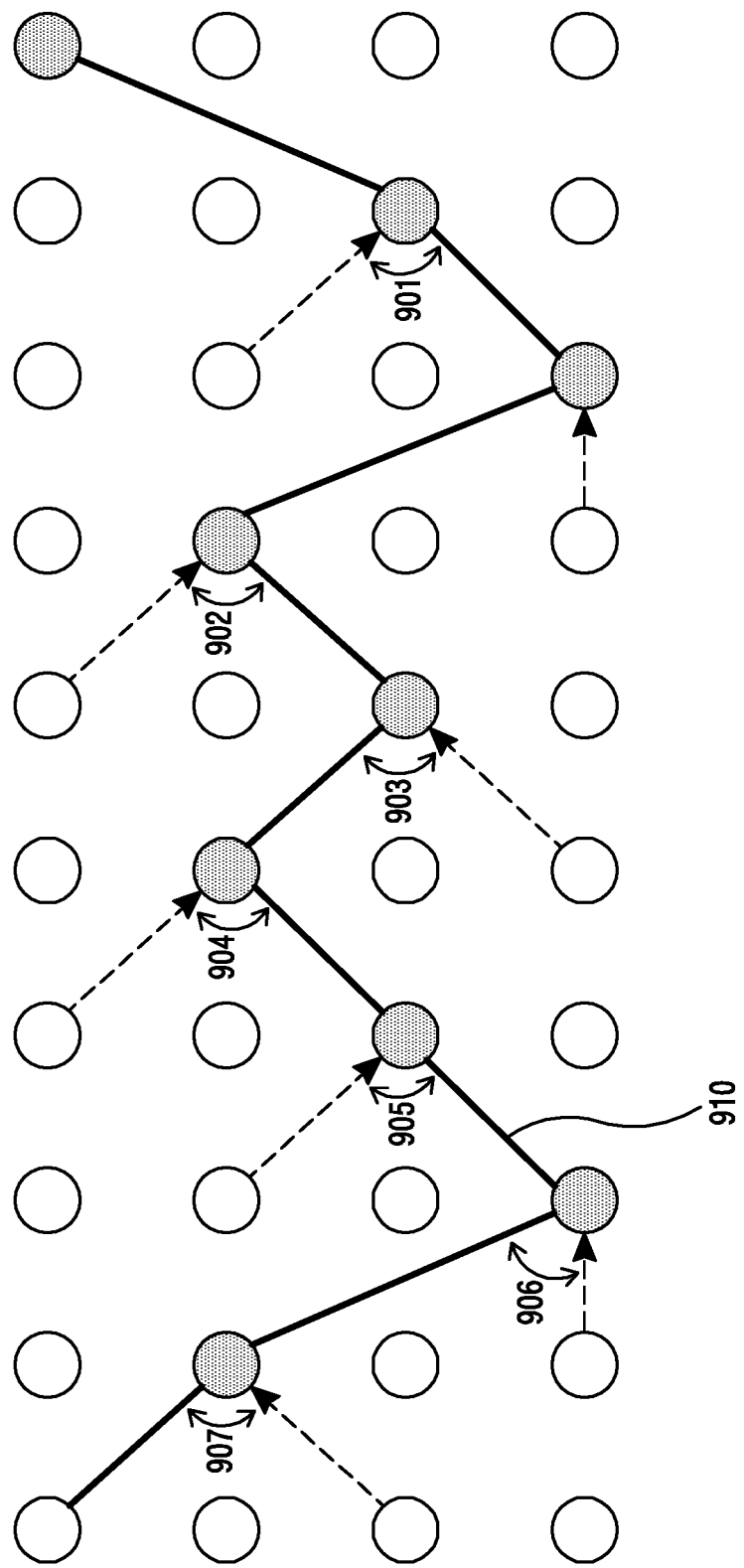
FIG. 9 is a diagram illustrating a method of generating an L-th best path on a trellis of an LVD, according to an embodiment of the present disclosure.

FIG. 9 is a diagram illustrating a method of generating an L-th best path on a trellis of an LVD, according to an embodiment of the present disclosure. Although a process of adding a code word candidate group list in serial is described in the following embodiment, it should not be understood that the embodiments of the present disclosure are not limited thereto. Thus, according to another embodiment, a process of adding the code word candidate group list in parallel may also be considered.

A reference numeral 910 indicates a most similar path, i.e., a first best path, of the LVD, according to an embodiment of the present disclosure. A process of determining the most similar path by using an LVD algorithm may be apparent to those ordinarily skilled in the art. If an error is detected in a first code word corresponding to the first best path, that is, a first decoding result, the LVD may determine whether to generate a second best path for generating a second code word.

In order to determine whether to generate the second best path, the LVD may determine whether a list count exceeds a maximum value $L_{max}$ and whether a first APMD is less than $thr_{APMD}$. Herein, the first APMD value corresponds to an APMD value of a node having a smallest APMD value in the first best path. If it is assumed that $L_{max}$ is 2, since the list count for generating the second best path is 1, the list count does not exceed $L_{max}$. Reference numerals 901 to 907 indicate respective APMD values in respective nodes on the first best node. If the APMD value of the reference numeral 901 is the smallest value, this value may be the first APMD value. The LVD may determine whether the first APMD value is less than $thr_{APMD}$. If the $1^{st}$ APMD value is greater than $thr_{APMD}$, the LVD may declare a decoding failure instead of generating the second best path for generating a second code word candidate group. This is because the APM value is a value indicating a close relation to a distance between a received signal and a code word. Therefore, an increase in the APMD leads to a growing increase in a most similar path, i.e., a distance between the first code word corresponding to the first best path and a code word of candidate groups, and thus, a false alarm may be increased. Therefore, even if the list count does not exceed $L_{max}$, that is, even if the list count does not exceed a maximum value, if first APMD>$thr_{APMD}$, the LVD may declare a decoding failure. In addition, the LVD may end the decoding operation. According to another embodiment of the present disclosure, if the first APMD value is less than $thr_{APMD}$, the LVD may generate the second best path in a node corresponding to the first APMD. The LVD may generate the $2^{nd}$ code word corresponding to the second best path, and may determine whether a decoding result has an error. If the error is not detected in the second code word, decoding may end. On the contrary, if the error is detected in the second code word, the LVD may determine whether to generate a third best path for generating a third code word.

To determine whether to generate the third best path, the LVD may determine whether a list count exceeds a maximum value $L_{max}$ and whether a $2^{nd}$ APMD is less than $thr_{APMD}$. Herein, the second APMD value may correspond to an APMD value of a node having a second smallest APMD value in the first best path. If it is assumed that $L_{max}$ is 2, since the list count for generating the third best path is 2, it can be seen that the list count does not exceed $L_{max}$. If an APMD value of the reference numeral 903 is the second smallest value, this value may be the second APMD value. The LVD may determine whether the second APMD value is less than $thr_{APMD}$. If the second APMD value is greater than $thr_{APMD}$, the LVD may declare a decoding failure instead of generating the third best path for generating the third code word. According to another embodiment of the present disclosure, if the second APMD value is less than $thr_{APMD}$, the LVD may generate the $3^{rd}$ best path in a node corresponding to the second APMD value. The LVD may generate the third code word candidate group corresponding to the third best path, and may determine whether a decoding result has an error. If the error is not detected in the third code word, decoding may end. On the contrary, if the error is detected in the third code word, the LVD may determine whether to generate a fourth best path for generating a fourth code word.

To determine whether to generate the fourth best path, the LVD may determine whether a list count exceeds a maximum value $L_{max}$ and whether a third APMD value is less than $thr_{APMD}$. Herein, the third APMD value may correspond to an APMD value of a node having a third smallest APMD value in the first best path. If it is assumed that $L_{max}$ is 2, since the list count for generating the fourth best path is 3, it can be seen that the list count does not exceed $L_{max}$. In this case, the LVD may declare a decoding failure. This is because a performance gain is expected mostly in an initial list count in case of the LVD, and the performance gain is converged by being gradually decreased as the list count is increased. Further, this is because a PMD with respect to a most similar path, i.e., the first best path, may be gradually increased when the list count is increased. Since a distance between the most similar path, i.e., the first code word having the first best path, and a code word of candidate groups is gradually increased, a false alarm may be increased, and thus, it is restricted that the list count does not exceed any pre-set value $L_{max}$.

As set forth above, although the LVD determines whether the list count exceeds $L_{max}$ and thereafter determines whether the APMD value is less than $thr_{APMD}$, the LVD may also determine whether the APMD value is less than $thr_{APMD}$ and thereafter whether the list count reaches $L_{max}$. Further, although $L_{max}$ is set to 2, other embodiments of the present disclosure are not limited thereto.

Figure 10:
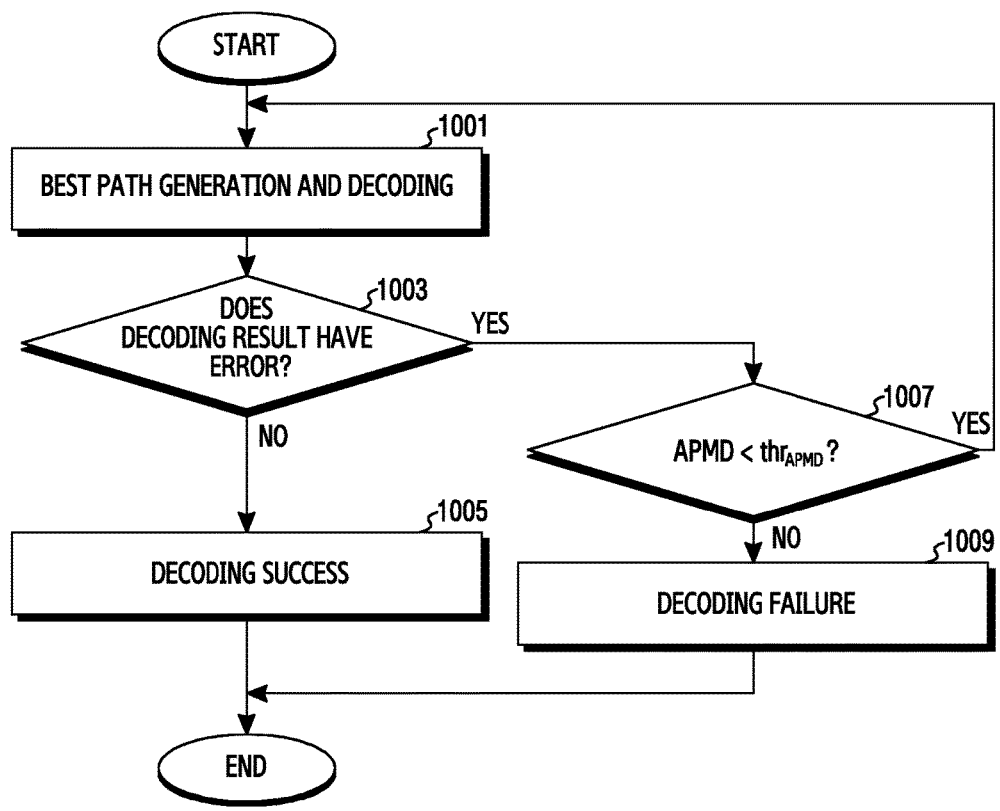
FIG. 10 is a flowchart illustrating a process for determining whether to generate an L-th code word when an APMD value is restricted, according to an embodiment of the present disclosure.

FIG. 10 is a flowchart illustrating a procedure for determining whether to generate an L-th code word when an APMD value is restricted, according to an embodiment of the present disclosure. Although a process of adding a code word candidate group list in serial is described below, embodiments of the present disclosure are not limited thereto. Thus, a process of adding the code word candidate group list in parallel (simultaneously) may also be considered.

In step 1001, an LVD generates a best path, and performs decoding. More specifically, the LVD may generate a code word candidate group corresponding to the generated path through the decoding. In step 1001, the LVD may generate a second best path, and may generate a second code word corresponding to the second best path according to a decoding result.

In step 1003, the LVD determines whether the decoding result has an error. More specifically, the error detector 850 may detect whether the decoded code word has an error. The LVD may detect whether the second code word corresponding to the second best path has an error.

If the error is not detected in the decoding result, the LVD declares a decoding success, in step 1005, and terminates the decoding. If no error is detected in the second code word corresponding to the second best path, the LVD may determine a decoding success and may end the decoding.

If the error is detected in the decoding result, in step 1003, the LVD determines whether an APMD value is less than $thr_{APMD}$, in step 1007, in order to generate a new best path. If the error is detected in the second code word, it may be determined whether a second APMD value is less than $thr_{APMD}$ based on a decision of generating a third best path for generating a third code word. If the $2^{nd}$ APMD value is greater than $thr_{APMD}$, the LVD declares a decoding failure, in step 1009, instead of generating a new best path (in this case, it may be the third best path). Additionally, the LVD may end the decoding operation. This is because the APM value indicates a close relation between a received signal and a code word. Therefore, an increase in the APMD value leads to a growing increase in a most similar path, i.e., a distance between a code word having a first best path and a code word of candidate groups, and thus, false alarms may be increased.

If the APMD value is less than $thr_{APMD}$, the LVD returns to step 1001 and generates the new best path or performs the decoding operation. The LVD may generate the third best path based on a node on the first best path corresponding to the second APMD value. In addition, the LVD may decode a code word corresponding to the third best path.

As to the decoding result, the list Viterbi decoder may detect whether an error is included in operation 1003. The error detection may be achieved by using the error detector 805. According to one exemplary embodiment, the list Viterbi decoder may detect whether there is an error in the $3^{rd}$ code word corresponding to the $3^{rd}$ best path. If the error is not included in the $3^{rd}$ code word as a result of the error detection, a decoding success may be declared in operation 1005. In addition, the list Viterbi decoder may end the decoding operation. Otherwise, if the error is included in the $3^{rd}$ code word as the result of the error detection, returning to operation 1007, the list Viterbi decoder may determine whether a $3^{rd}$ APMD value is less than $thr_{APMD}$ in order to determine whether to generate a new best path (herein, it may be a $4^{th}$ best path).

Figure 11:
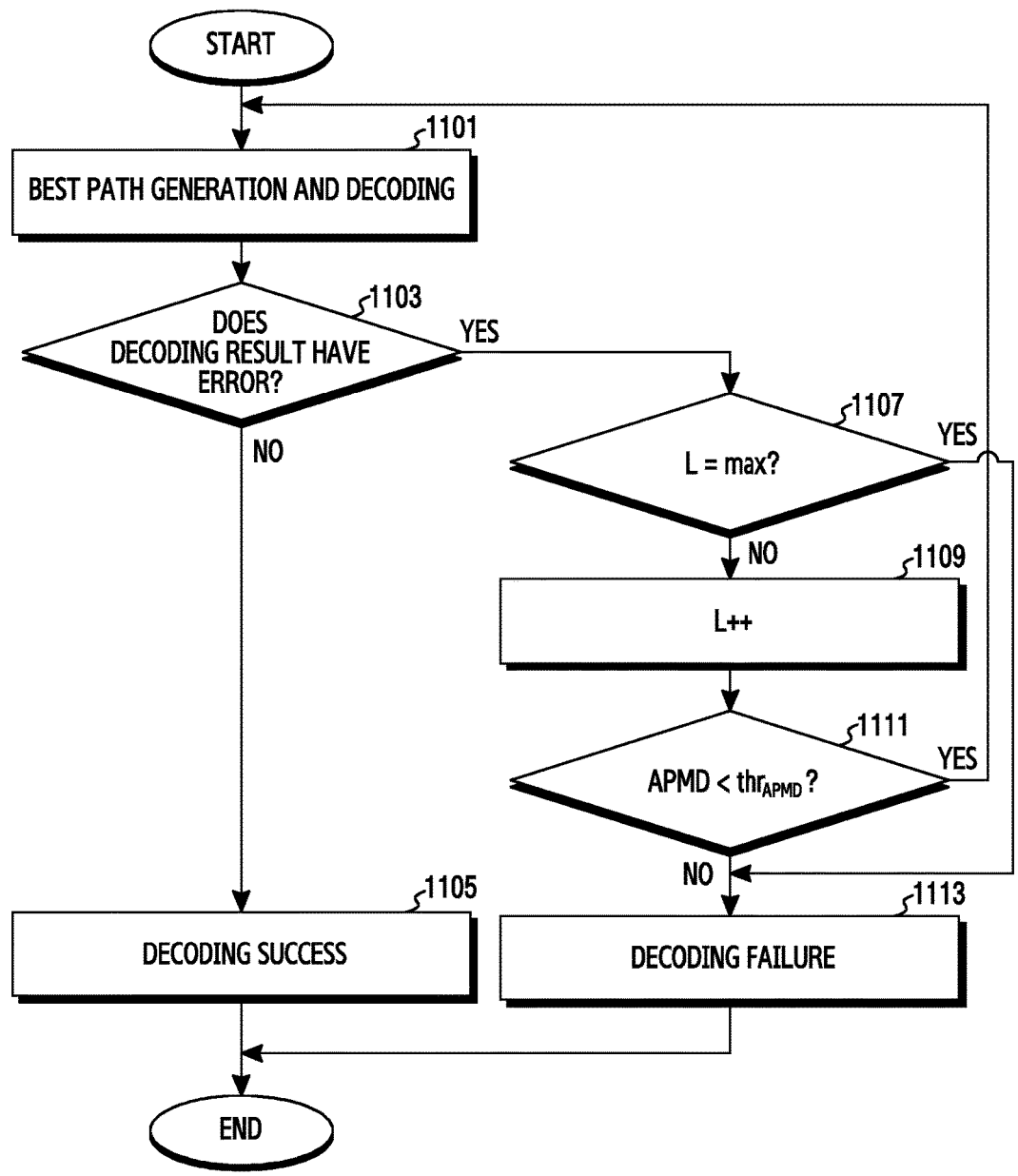
FIG. 11 is a flowchart illustrating a process for determining whether to generate an L-th code word when an APMD value and a list count are restricted, according to an embodiment of the present disclosure.

FIG. 11 is a flowchart illustrating a process for determining whether to generate an L-th code word when an APMD value and a list count are restricted, according to an embodiment of the present disclosure. Although a process of adding a code word candidate group list in serial is described below, embodiments of the present disclosure are not limited thereto. Thus, a process of adding the code word candidate group list in parallel (simultaneously) may also be considered.

In step 1101, an LVD generates a best path, and performs decoding. More specifically, the LVD may generate a code word candidate group corresponding to the generated path through the decoding. In step 1101, the LVD may generate a second best path, and may generate a second code word corresponding to the second best path according to a decoding result.

In step 1103, the LVD determines whether the decoding result has an error. More specifically, the error detector 850 of FIG. 8 may detect whether the decoded code word has an error. The LVD may detect whether the second code word corresponding to the second best path has an error.

If the error is not detected in the decoding result, the LVD declares a decoding success and ends the decoding in step 1105. If no error is detected in the second code word corresponding to the second best path, the LVD may determine a decoding success and may end the decoding.

If the error is detected in the decoding result, the LVD determines whether the list count L reaches a pre-set list maximum value $L_{max}$ as a premise for generating a new best path, in step 1107. If the list count reaches $L_{max}$, the LVD declares a decoding failure, in step 113, and ends the decoding. This is because a performance gain may be expected mostly in an initial list count in the case of the LVD, and thus, the performance gain may be converged by being gradually decreased as the list count is increased. Further, a PMD with respect to a most similar path, that is, a PMD with respect to a $^{first}$ best path, may be gradually increased when the list count is increased. For example, if $L_{max}$ is 3, since a list count corresponding to the second best path is L=1, it may be determined that the list count does not yet reach the maximum value $L_{max}$.

If the list count L does not yet reach $L_{max}$, the LVD increases the list count by +1 as a premise for generating a new best path, in step 1109. For example, if an error is detected in a first code word corresponding to the first best path in step 1103, the list count L may be 1 (0+1=1), in step 1109. Alternatively, if an error is detected in the second code word corresponding to the second best path in step 1103, the list count L may be 2 (1+1=2).

Thereafter, with the detection of the error in the decoding result, the LVD may determine whether an APMD value is less than $thr_{APMD}$, in step 1111, to generate a new best path. For example, with the detection of the error in the second code word, the LVD may determine whether a second APMD value is less than $thr_{APMD}$ based on a decision for generating a third best path. Alternatively, with the detection of the error in the third code word, the LVD may determine whether a third APMD value is less than $thr_{APMD}$ based on a decision for generating a fourth best path. Herein, the second APMD value implies a most similar path, that is, a second smallest APMD value in the first best path, and the third APMD value implies a third smallest APMD value in the first best path. For example, if the second APMD value is greater than or equal to $thr_{APMD}$, the LVD declares a decoding failure, in operation 1113, instead of generating the third best path. Additionally, the LVD ends the decoding operation. This is because the APM value is a value indicating a close relation between a received signal and a code word. Therefore, an increase in the APMD value leads to a growing increase in a most similar path, i.e., a distance between a code word having the first best path and a code word of candidate groups, and thus, false alarms may be increased.

If the APMD value is less than $thr_{APMD}$, the LVD returns to step 1101 and generates the new best path or performs the decoding operation. For example, if the second APMD value is less than $thr_{APMD}$, the LVD may generate the third best path in step 1101. Additionally, the LVD may generate a third code word corresponding to the third best path.

Thereafter, in operation 1103, the list Viterbi decoder may determine whether the decoding result has an error. More specifically, the error detection may be performed by using the error detector 850. According to one exemplary embodiment, in operation 1103, the list Viterbi decoder may detect whether the $2^{nd}$ code word has an error. If the error is not detected, the list Viterbi decoder may employ the $2^{nd}$ code word and may declare a decoding success in operation 1105. In addition, the list Viterbi decoder may end the decoding operation.

Although the description of FIG. 11 is based on a decision process for generating the third best path upon detection of the error in the second code word, it is also possible to include a process for deciding whether the second best path, the third best path, the fourth best path, or the like, is generated upon detection of an error in the first code word, the second code word, the third code word, or the like, in step 1103

Figure 12:
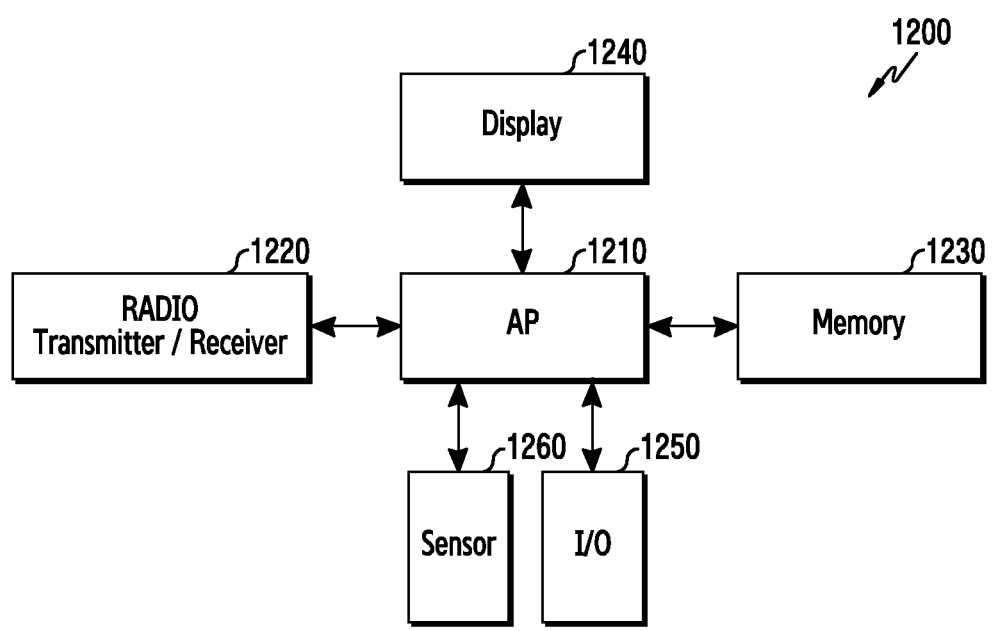
FIG. 12 is a diagram illustrating a hardware structure of an Internet of Things (IoT) device including a wireless communication chip, according to an embodiment of the present disclosure.

FIG. 12 is a diagram illustrating a hardware structure of an IoT device including a wireless communication chip, according to an embodiment of the present disclosure.

Referring to FIG. 12, an IoT device 1200 includes a communication interface 1220 for communication with the outside. The communication interface 1220 may be, for example, a wireless near-distance communication interface such as a LAN, BT, Wi-Fi, and Zigbee, or a modem communication interface accessible to a mobile cellular network such as power line communication (PLC), $3^{rd}$ generation (3G), LTE, etc.

The communication interface 1220 may include a transmitter and/or a receiver. The IoT device 1200 may transmit and/or receive information from an access point or a gateway via the transmitter and/or the receiver. Further, the IoT device 1200 may communicate with a user device or another IoT device to transmit and/or receive control information or data of the IoT device 1200.

The IoT device 1200 further includes a processor, an application processor 1210 or the like, for performing an arithmetic operation. The IoT device 1200 may have a battery embedded therein to provide internal power or may further include a power supply unit for receiving power from the outside. Further, the IoT device 1200 includes a display 1240 for displaying an internal state or data. The user may control the IoT device 1200 via a user interface (UI) of the display 1240 of the IoT device 1200. The IoT device 1200 may transmit the internal state and/or the data to the outside via the transmitter, and may receive a control instruction and/or data from the outside via the receiver.

A memory 1230 may store a control command code, control data, or user data for controlling the IoT device 1200. The memory 1230 may include at least one of a volatile memory and a nonvolatile memory. The nonvolatile memory includes a ROM, a PROM, an EPROM, an EEPROM, a flash memory, a phase-change RAM (PRAM), a magnetic RAM (MRAM), a resistive RAM (RRAM), a ferroelectric RAM (FRAM), or the like. The volatile memory may include at least one of various memories such as a DRAM, a SRAM, a SDRAM, a PRAM, a MRAM, a RRAM, a FeRAM, or the like.

The IoT device 1200 may further include a storage device. The storage device may be a nonvolatile medium such as a hard disk drive (HDD), a solid state disk (SSD), an embedded multi-media card (eMMC), and a universal flash storage (UFS). The storage device may store user's information provided through an input/output unit 1250 and sensing information collected through a sensor 1260.

The IoT device 1200 may perform a decoding operation while receiving data. The IoT device 1200 may include a decoding device (or chip). The decoding device may be included in the communication interface 1220. The decoding device may be a communication processor (CP).

The decoding device may instead be included in the AP 1210. The decoding device may be a part of an element of the AP 1210.

The IoT device 1200 including the decoding device may declare a decoding failure when an APMD value is greater than $thr_{APMD}$, even if a list count does not reach $L_{max}$. This technique may be utilized to decrease a false alarm while maintaining decoding performance.

Methods based on embodiments described herein can be implemented in hardware, software, or a combination of both.

When implemented in software, a computer readable recording medium for storing one or more programs (i.e., software modules) can be provided. The one or more programs stored in the computer readable recording medium are configured to be executed by one or more processors in an electronic device. The one or more programs include instructions for allowing the electronic device to execute the methods based on various embodiments of the present disclosure.

The program (i.e., the software module or software) can be stored in a RAM, a non-volatile memory including a flash memory, a ROM, an EEPROM, a magnetic disc storage device, a CD-ROM, DVDs or other forms of optical storage devices, and a magnetic cassette. Alternatively, the program can be stored in a memory configured in combination of all or some of these storage media. Further, the configured memory may be plural in number.

Further, the program can be stored in an attachable storage device capable of accessing the electronic device through a communication network such as the Internet, an intranet, a LAN, a WLAN, or a storage area network (SAN) or a communication network configured by combining the networks. The storage device can access the electronic device via an external port. Furthermore, an additional storage unit on a communication network can access a device for performing the embodiments of the present disclosure.

In the aforementioned embodiments of the present disclosure, an element included in the disclosure is expressed in a singular or plural form according to the specific example embodiment proposed herein. However, the singular or plural expression is selected properly for a situation proposed for the convenience of explanation, and thus the disclosure is not limited to a single or a plurality of elements. Therefore, an element expressed in a plural form can also be expressed in a singular form, or vice versa.

The present disclosure may be utilized in conjunction with the manufacture of integrated circuits, chip sets, or SoCs. One skilled in the art would know how to dice wafers and package die to produce integrated circuits. Integrated circuits so manufactured are considered part of this disclosure.

While the disclosure has been shown and described with reference to certain embodiments thereof, it will be understood by those skilled in the art that various changes in form and detail may be made therein without departing from the spirit and scope of the disclosure as defined by the appended claims.

What is claimed is:

1. A method for operating a receiving device in a communication system, the method comprising:
    receiving, by a transceiver, from a transmit device, a signal;
    obtaining, by a processor comprising a list Viterbi decoder, an input signal for the list Viterbi decoder from the received signal;
    applying, by the processor, a list Viterbi decoding to the input signal to obtain a codeword associated with a path metric difference (PMD);
    in response to detecting an error for the codeword associated with the PMD, determining, by the processor, whether the PMD is greater than or equal to a PMD threshold, or less than the PMD threshold; and in response to determining that the PMD is greater than or equal to the PMD threshold, determining, by the processor, that a decoding of the input signal is failed, wherein the PMD threshold is determined, by the processor, based on a level of the input signal and a PMD limit value,
    wherein the PMD is determined based on the level of the input signal, and
    wherein the PMD is associated with a distance between the codeword and the received signal.

2. The method of claim 1, further comprising generating another codeword and checking an error of the generated another codeword, in response to determining that the PMD is less than the PMD threshold.

3. The method of claim 2, wherein checking the error comprises:
    determining a list count upon occurrence of the error;
    declaring a decoding failure and ending performing of the decoding, if the list count is equal to a maximum count; and
    resuming the decoding by using the PMD threshold, if the list count is not equal to the maximum count.

4. The method of claim 2, further comprising transmitting decoded data to a source decoder if error checking is successful in the checking of the error of the generated another codeword.

5. The method of claim 2, further comprising:
comparing a PMD of the another codeword and the PMD threshold, if error checking is successful in the checking of the error of the generated another codeword; and
declaring a decoding error and ending performing of the decoding, if the PMD of the another codeword is greater than the PMD threshold.

6. The method of claim 1, wherein the level of the input signal is an average level of the input signal.

7. A method for operating a receiving device in a communication system, the method comprising:
receiving, by a transceiver from a transmit device, a signal;
obtaining, by a processor comprising a list Viterbi decoder, an input signal for the list Viterbi decoder from the received signal;
applying, by the processor, a list Viterbi decoding to the input signal to obtain a codeword associated with a first path metric difference (PMD);
in response to detecting an error for the codeword associated with the first PMD, determining, by the processor, whether the first PMD is below a PMD threshold, or greater than or equal to the PMD threshold; and
in response to determining that the first PMD is below the PMD threshold, generating, by the processor, another codeword associated with a second PMD,
wherein the PMD threshold is determined, by the processor, based on a level of the input signal and a PMD limit value,
wherein the first PMD and the second PMD are determined based on the level of the input signal, and
wherein the first PMD and the second PMD are associated with a distance between the codeword and the received signal.

8. The method of claim 7, wherein the PMD threshold is a product of an average value of the level of the input signal and the PMD limit value.

9. The method of claim 8, wherein the average value of the level of the input signal is determined by:

$$I_{in} = \frac{1}{m}\sum_{n=1}^{m} a_n,$$

where $I_{in}$ is the average value of the level of the input signal, $a_n$ is an input signal value, and m is a codeword length.

10. The method of claim 8, wherein the PMD limit value is 2×K, where K is a number of errors generated in a data sequence.

11. The method of claim 7, further comprising: detecting an error in the another codeword;
detecting a list count;
declaring a decoding failure and ending a decoding of the input signal, if the list count is equal to a maximum count; and
resuming the decoding by using the PMD threshold, if the list count is not equal to the maximum count.

12. The method of claim 7, further comprising declaring a decoding failure and ending a decoding of the input signal, in response to determining that the first PMD exceeds the PMD threshold.

13. An apparatus for receiving in a communication system comprising:
a transceiver configured to receive, from a transmit device, a signal; and a processor comprising a list Viterbi decoder configured to:
obtain an input signal for the list Viterbi decoder from the received signal; apply a list Viterbi decoding to the input signal to obtain a codeword associated with a path metric difference (PMD),
in response to detecting an error for the codeword associated with the PMD, determine whether the PMD is greater than or equal to a PMD threshold, or less than the PMD threshold, and
in response to determining that the PMD is greater than or equal to the PMD threshold, determine that a decoding of the input signal is failed,
wherein the PMD threshold is determined based on a level of the input signal and a PMD limit value,
wherein the PMD is determined based on the level of the input signal, and
wherein the PMD is associated with a distance between the codeword and the received signal.

14. The apparatus of claim 13, wherein the processor is further configured to generate another codeword and check an error of the generated another codeword, in response to determining that the PMD is less than the PMD threshold.

15. The apparatus of claim 13, wherein the PMD threshold is a product of an average value of an input signal level and the PMD limit value.

16. The apparatus of claim 15, wherein the average value of the input signal level is determined by:

$$I_{in} = \frac{1}{m}\sum_{n=1}^{m} a_n,$$

where $I_{in}$ is the average value of the input signal level, $a_n$ is an input signal value, and m is a codeword length.

17. The apparatus of claim 15, wherein the PMD limit value is 2×K, where K is a number of errors of a codeword.

18. The apparatus of claim 13, wherein the processor is further configured to control to check a cyclic redundancy of a codeword decoded by the list Viterbi decoder.

19. The apparatus of claim 13, wherein the processor is further configured to control to examine a list count, if an error is detected in the codeword, and declare a decoding failure and end the decoding, if the list count is equal to a maximum count.

20. A method for operating a receiving device in a communication system, the method comprising:
receiving, by a transceiver, from a transmit device, a signal;
obtaining, by a processor comprising a list Viterbi decoder, an input signal for the list Viterbi decoder from the received signal;
applying, by the processor, a list Viterbi decoding to the input signal to obtain a codeword associated with a first path metric difference (PMD);
determining, by the processor, whether the codeword has an error;
declaring, by the processor, a decoding success, when the codeword does not have an error; and
when the codeword has an error:
determining, by the processor, whether the first PMD is less than a PMD threshold, or greater than or equal to the PMD threshold;

declaring, by the processor, a decoding failure, when the first PMD is greater than or equal to the PMD threshold; and performing, by the processor, decoding to generate a next codeword associated with a second PMD, when the first PMD is less than the PMD threshold, wherein the PMD threshold is determined, by the processor, based on a level of the input signal and a PMD limit value, wherein the first PMD and the second PMD are determined based on the level of the input signal, and wherein the first PMD and the second PMD are associated with a distance between the codeword and the received signal.

* * * * *